United States Patent
Tsai

(10) Patent No.: US 6,987,431 B2
(45) Date of Patent: Jan. 17, 2006

(54) ELECTROMAGNETIC INTERFERENCE FILTER

(75) Inventor: Ming-chih Tsai, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 0 days.

(21) Appl. No.: 10/748,213

(22) Filed: Dec. 31, 2003

(65) Prior Publication Data

US 2004/0233015 A1 Nov. 25, 2004

(30) Foreign Application Priority Data

May 20, 2003 (TW) .................................. 92209213 U

(51) Int. Cl.
*H03H 7/00* (2006.01)

(52) U.S. Cl. ....................................... 333/181; 333/185

(58) Field of Classification Search ................. 333/167, 333/181, 185, 12
See application file for complete search history.

(56) References Cited

U.S. PATENT DOCUMENTS

| | | | | |
|---|---|---|---|---|
| 4,611,185 A | * | 9/1986 | Dirmeyer et al. | 333/181 |
| 4,620,165 A | * | 10/1986 | Kinzler | 333/185 |
| 4,757,282 A | * | 7/1988 | Sakamoto et al. | 333/181 |

* cited by examiner

*Primary Examiner*—Seungsook Ham
(74) *Attorney, Agent, or Firm*—Birch, Stewart, Kolasch & Birch LLP

(57) ABSTRACT

An electromagnetic interference filter is disclosed. An inductance coil with four wires extended there-from, a ceramic capacitance board, a metallic film capacitance and a grounded wire are included. The ceramic capacitance board is provided with a plurality of metallic film areas on a first surface and one metallic film area on a second surface and thus forms a plurality of separate capacitance electrodes on it. The invention is characterized in that two wires extended from the inductance coil are electrically connected to the capacitance electrodes while the other two wires extended from the inductance coil are electrically connected to the wires of the metallic film capacitance, and one terminal of the grounded wire is electrically connected to the metallic film area on the second surface of the ceramic capacitance board.

20 Claims, 7 Drawing Sheets

ELECTROMAGNETIC INTERFERENCE FILTER

This Nonprovisional application claims priority under 35 U.S.C. §119(a) on Patent Application No(s). 092209213 filed in TAIWAN on May 20, 2003, the entire contents of which are hereby incorporated by reference.

BACKGROUND OF THE INVENTION

1. Field of the Invention

The present invention relates to a filter and, more particularly, to an electromagnetic interference filter.

2. Description of the Related Art

There are problems of interference in circuits of the electronic devices that share one power supply device, and the most is electromagnetic interferences (EMI). A power supply unit is essential to almost every electric appliance and always become a main source of electromagnetic interferences. For this reason, most power supply devices are provided with an electromagnetic interference filter (EMI filter).

FIGS. 1A & 1B are the lateral view and the top view of a conventional EMI filter 1 respectively. Referring to FIG. 1B, the capacitor 11 of the EMI filter 1 consists of two ceramic capacitors (also called the Y capacitors) 111 and a metallic film capacitance (also called the X capacitor) 112. FIG. 1C shows the assembly procedure of the capacitor 11. Since the ceramic capacitors 111 and the metallic film capacitance 112 included in the capacitor 11 are standard products, the cost of the insulating materials 1111 used to cover the ceramic capacitor 111 and the insulating materials 113 used to cover the metallic film capacitance 112 in the manufacturing process can be greatly risen. Besides, the illustrated method of assembling the ceramic capacitors 111 and metallic film capacitance 112 always increases the size of the capacitor 11, and thus increases the size of the entire EMI filter 1. Although, as shown in FIG. 1D, two metallic film capacitances 112' and 112" can be combined to form the above-mentioned capacitor 11, the circuit of this capacitor 11 cannot be separated in application.

Thus, either the compounded capacitor 11 made up of a metallic film capacitance and a ceramic capacitor or the compounded capacitor 11' made up of two metallic film capacitances has limitations in the EMI filter application.

Referencing back to FIGS. 1A and 1B, there are only three electric circuit contacts required for the capacitor 11, i.e. a, b, and c as shown. Therefore, the repeat procedure of arranging the four wires of the ceramic capacitor 111 will be needed and the cost for the operation will be raised as well. In addition, the entire EMI filter 1 further requires additional non-electronic components such as printed circuit board 13 to establish electric circuit contacts, and electrodes 14$a$ and 14$b$ such as PVC line or metal terminal to create the input/output terminals. Therefore, from the entire point of view, the conventional EMI filter has high manufacturing cost and low economic benefits, and does not meet the production need.

SUMMARY OF THE INVENTION

In order to solve the above-mentioned problems of a conventional electromagnetic interference filter, the main object of the present invention is to provide an improved electromagnetic interference filter.

An object of the present invention is to provide an electromagnetic interference filter (EMI filter) that is smaller in size and has less covering materials than the conventional ones.

Another object of the present invention is to provide an EMI filter that does not require any additional non-electronic components to complete circuit connections. Besides, complicate and repetitive line managing procedure can be prevented so that the production cost can be reduced.

A further object of the present invention is to provide an EMI filter of which the metallic film capacitance and the ceramic capacitor can be applied separately or together depending on the need.

The present invention utilizes a ceramic capacitor having two capacitance electrode areas as a basic assembly module to assemble an inductance coil and a metallic film capacitance into an EMI filter. In which, the wires extended from the inductance coil can be used as the input/output terminal for inputting power, and forms a complete circuit with the help of a ground conductor. Besides, resistor and other electronic components can be added to the EMI filter depending on the various needs.

The EMI filter according to one embodiment of the invention includes an inductance coil having four wires extended therefrom, a ceramic capacitance board, a metallic film capacitance with two wires, and a grounded wire. A first surface of the ceramic capacitance board includes a plurality of metallic thin-film areas and a second surface of the ceramic capacitance board includes a metallic thin-film area. The metallic thin-file areas on the first surface area and the metallic thin-film area on the second surface therefore form a plurality of capacitance electrodes. One feature of the invention is that two wires of the inductance coil are electrically connected to the wires of the capacitance electrodes, the other two wires of the inductance coil are electrically connected to the wires of the metallic thin-film capacitance, and one terminal of the ground conductor is connected to the metallic thin-film area on the second surface.

The advantages of the invention are described as follows.

First, the metallic thin-film capacitance and the ceramic capacitance board are so once wrapped with a covering material that the covering material for the conventional ceramic capacitance can be saved. Thus, it reduces the size of the whole EMI filter. Secondly, the capacitance value of the capacitance electrode of the ceramic capacitance board can be changed by controlling the coated area of the metallic thin-film of the ceramic capacitance board, which provides wider applications without the restrictions of the current standards. Thirdly, the EMI filter uses the wires of inductance coil as the input/output terminals to establish a complete circuit and does not require printed circuit board, other non-electronic components, and additional wires for external power connections, and therefore substantially reduces the material cost. Fourthly, the metallic thin-film capacitance and the ceramic capacitance board can be electrically connected to each other or electrically connected to the other part respectively, which increases the flexibility of its application. Fifthly, a metallic housing or plastic housing can be added according to the needs to enhance the shielding effect for electromagnetic interferences and to provide a safety distance required between the EMI filter and other electronic components.

DETAILED DESCRIPTION OF THE PREFERRED EMBODIMENTS

Figure 1A:
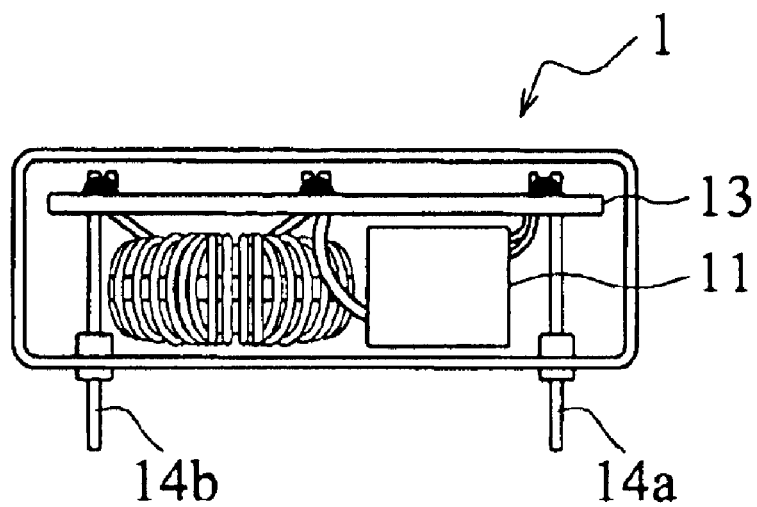
FIG. 1A is a lateral view illustrating internal elements of a conventional electromagnetic interference filter.
Figure 1B:
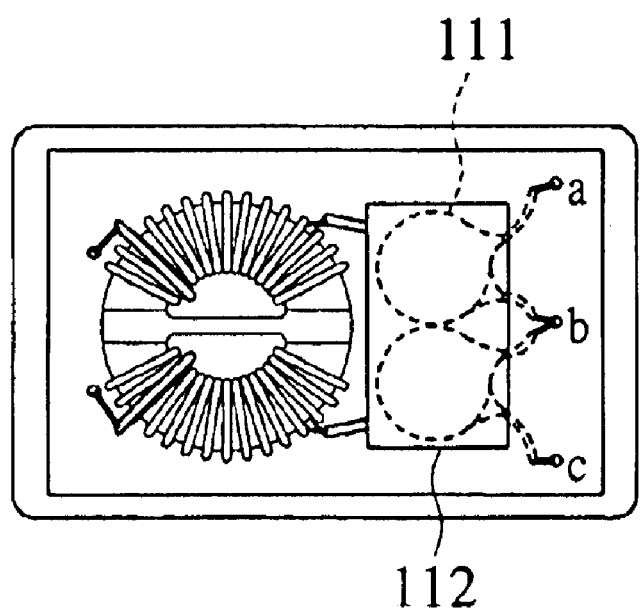
FIG. 1B is a top view illustrating internal elements of a conventional electromagnetic interference filter.
Figure 1C:
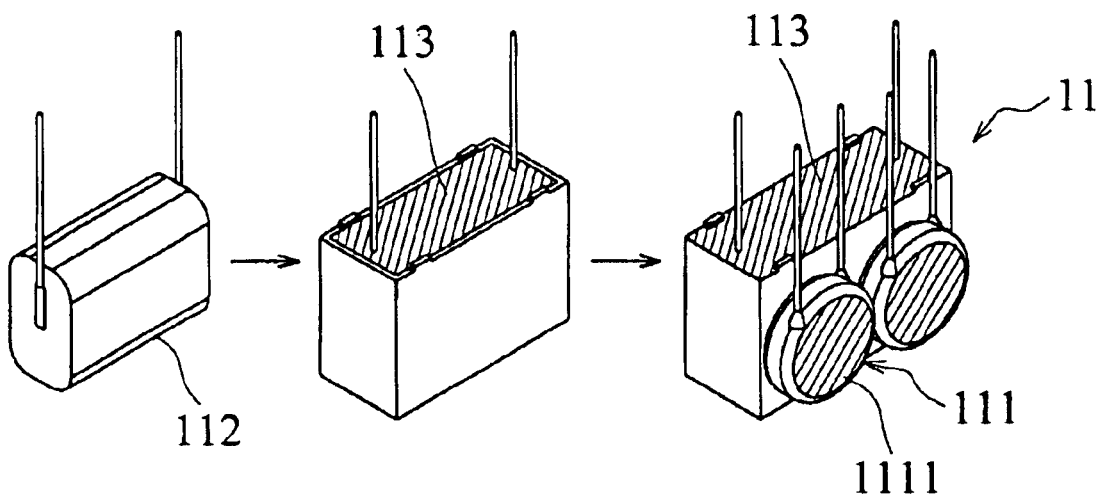
FIG. 1C is a flow chart illustrating the assembling process of a capacitor assembly for a conventional electromagnetic interference filter.
Figure 1D:
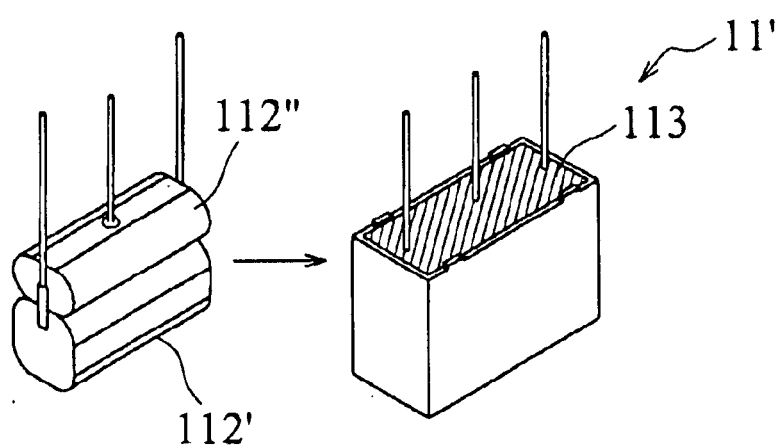
FIG. 1D is a flow diagram illustrating the production process of a compound capacitor assembly for a conventional electromagnetic interference filter.
Figure 2A:
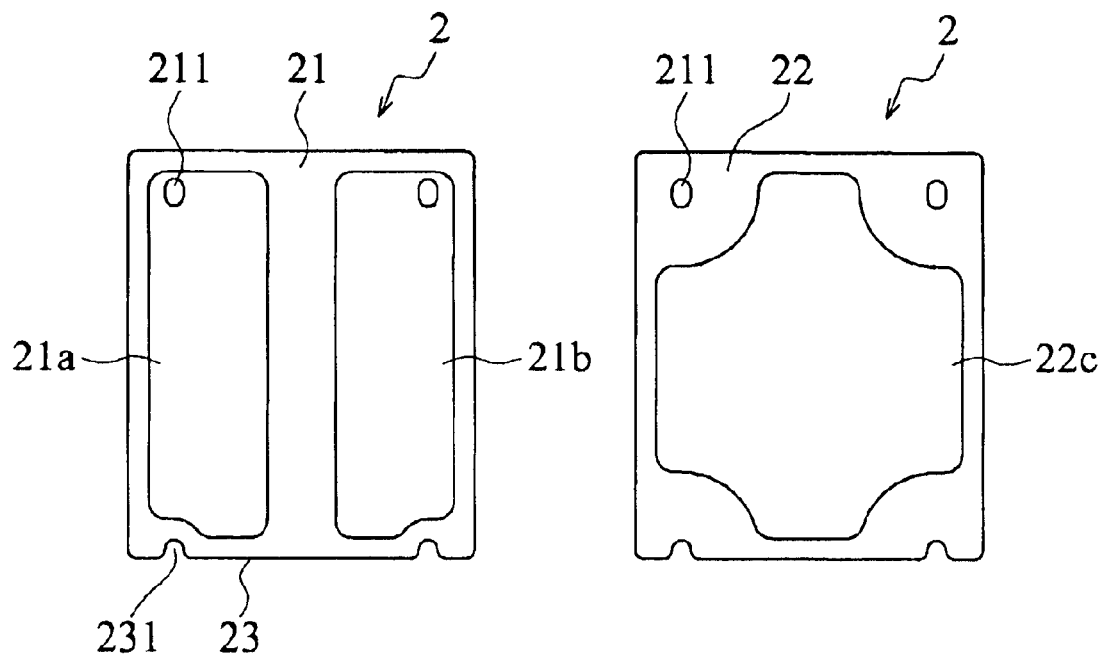
FIG. 2A is a schematic diagram showing the ceramic capacitance board of the electromagnetic interference filter according to one embodiment of the present invention.

The EMI filter according to the present invention serves a ceramic capacitance board as the base for assembly. In the following embodiment, metallic thin-film is used as the conductor thin-film for the ceramic capacitance board. Referring to FIG. 2A, the surface 21 of ceramic capacitance board 2 is coated with two separate metallic thin-film areas 21a and 21b. These metallic thin-film can be, for example, silver-film. Meanwhile, the surface 22 of ceramic capacitance board 2 is coated with a metallic thin-film area 22c. In consequence of this arrangement, each of the metallic thin-film areas 21a and 21b and the metallic thin-film area 22c thus form two capacitance-electrode areas. However, the number of metallic thin-film areas coated on the surface 21 of the ceramic capacitance board 2 is not limited to but more than two. Besides, each of the metallic film areas 21a and 21b has a through-hole 211, and two grooves 231 are formed on one end surface 23 of the ceramic capacitance board 2. These through-holes 211 and grooves 231 are used to assist in arranging wires in the follow-up assembly procedure (referring to FIG. 3A to 3F).

Figure 2B:
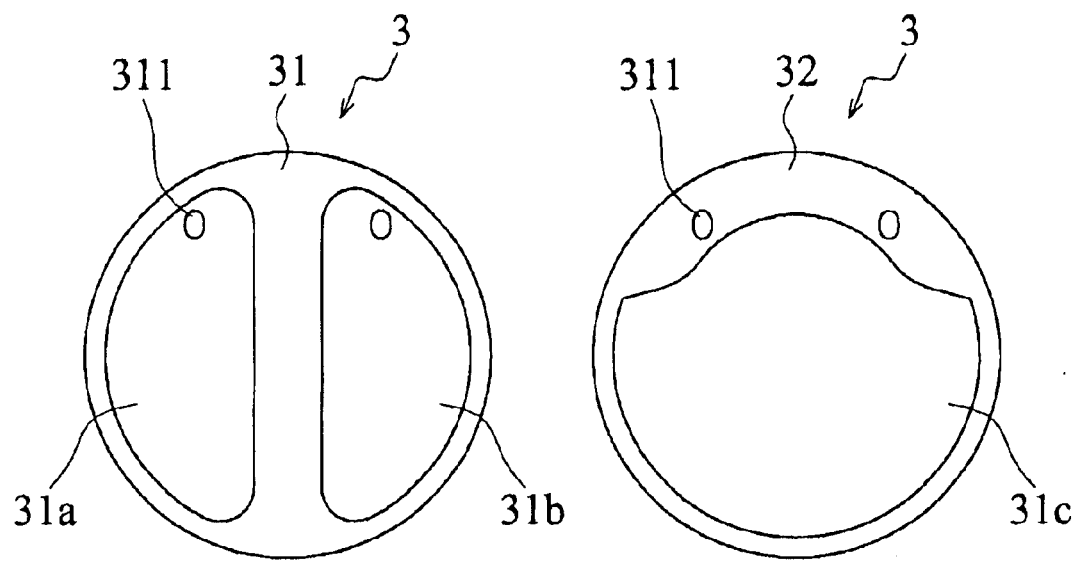
FIG. 2B is a schematic diagram showing the ceramic capacitance board of the electromagnetic interference filter according to another embodiment of the present invention.

Although the ceramic capacitance board provided in the embodiment is in rectangular shape, the ceramic capacitance board can be in any kind of shape. For example, a ceramic capacitance board can have a round shape, a polygon, or any regular or irregular shapes. As shown in FIG. 2B, the ceramic capacitance board 3 according to another embodiment of the present invention has a round shape. The ceramic capacitance board 3 also has two metallic thin-film areas 31a and 31b on a surface 31, and has one metallic thin-film area 31c on a surface 32. Each of the metallic thin-film areas 31a and 31b has a through-hole on it.

Furthermore, on the basis of the concept of the invention, if the objective of serving a ceramic capacitance board having two or more capacitance electrodes as an assembly board to complete the entire EMI filter can be achieved, the shape and the size of the ceramic capacitance board and the through-holes and the grooves on the ceramic capacitance board can be modified according to the needs. For example, we don't need the through-holes or grooves in some cases.

Figure 3A:
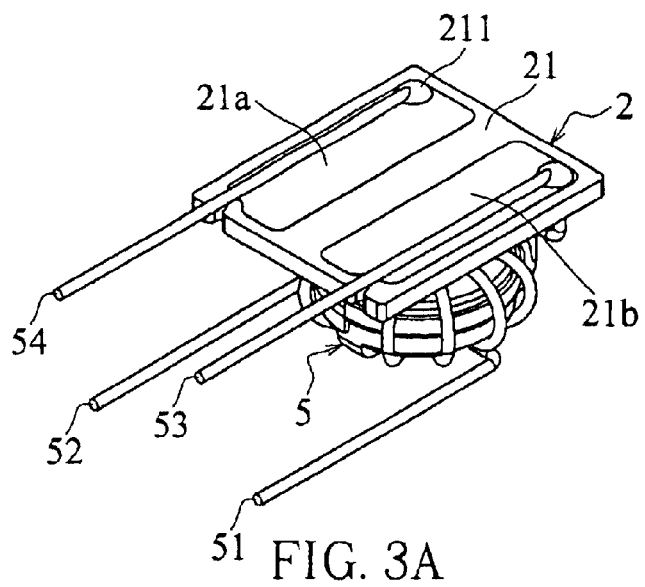
FIGS. 3A to 3F are flow charts illustrating a manufacturing method for the electromagnetic interference filter according to the present invention.
Figure 3B:
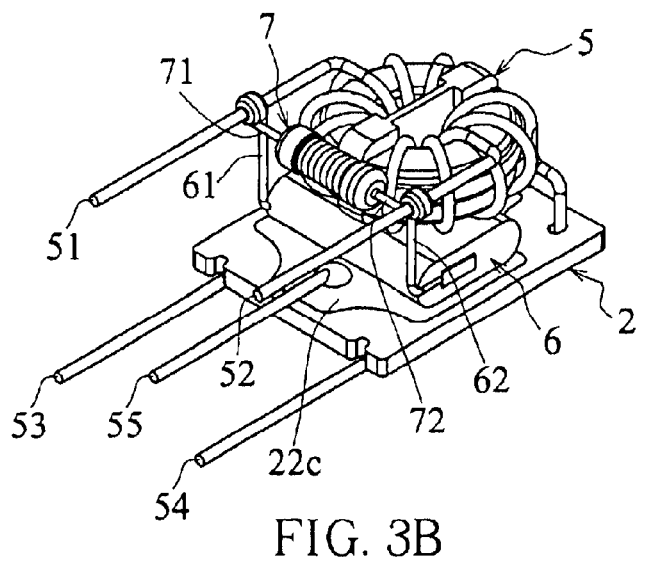
Figure 3C:
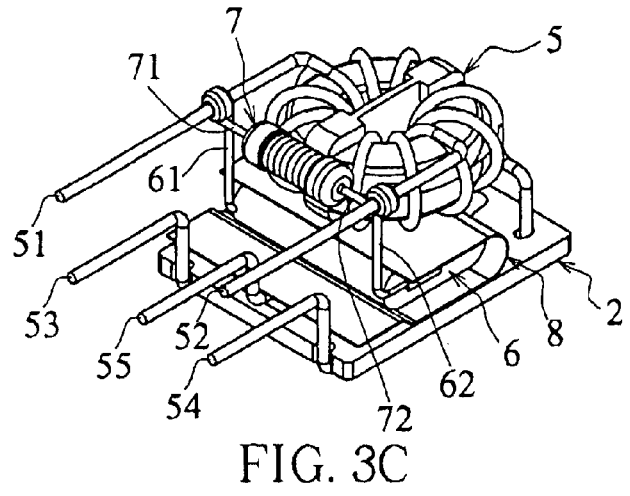
Figure 3D:
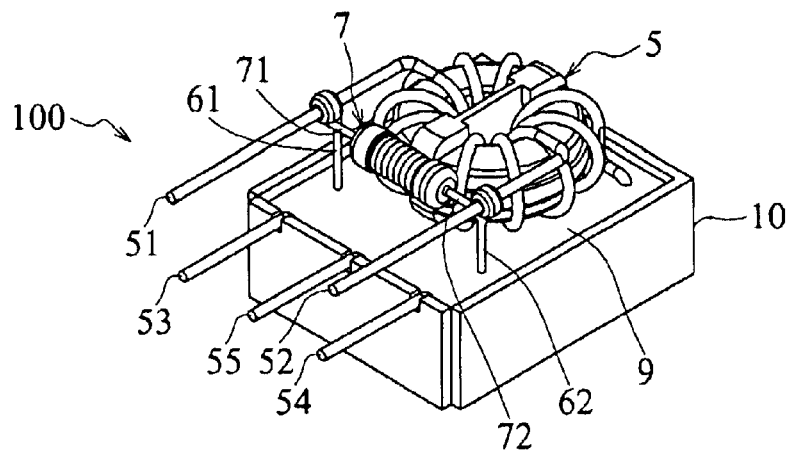
Figure 3E:
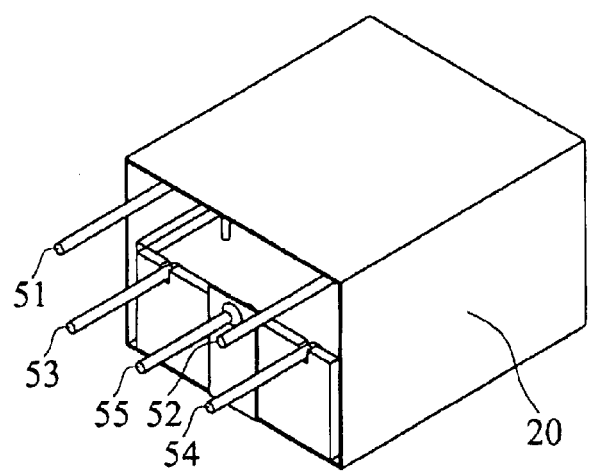
Figure 3F:
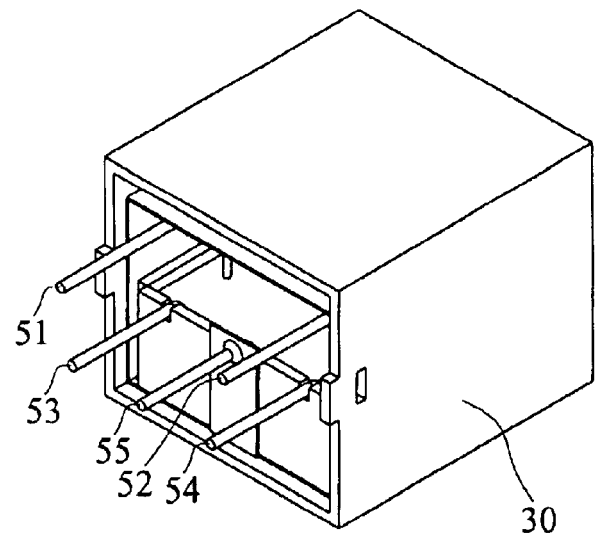

Referring to FIG. 3A to FIG. 3F, the assembling method for an EMI filter according to one embodiment of the invention is disclosed. First, as shown in FIG. 3A, an inductance coil 5 with four wires 51, 52, 53 and 54 extended there-from is provided, and two wires 53 and 54 are separately drew out through the through-hole 211 from a surface 22 to a surface 21 of the ceramic capacitance board 2 and bended to be parallel to the surface 21 of the ceramic capacitance board 2. Secondly, as shown in FIG. 3B, sets the ceramic capacitance board 2 upside down, electrically connects wires 61 and 62 of a metallic thin-film capacitance 6 to the two wires 51 and 52 of the inductance coil 5 respectively, and places the metallic thin-film capacitance 6 between the inductance coil 5 and the ceramic capacitance board 2. Except for the wires 61 and 62, no any part of the metallic thin-film capacitance 6 comes into contact with the inductance coil 5 and the ceramic capacitance board 2. After that, we electrically connect one end of a ground conductor 55 to a metallic thin-film area 22c of the ceramic capacitance board 2, while connect two wires 71 and 72 at two ends of a resistor 7 to two wires 51 and 52 of the inductance coil 5 respectively. Furthermore, an insulating sheet 8 is used to cover the metallic thin-film capacitance 6 to further prevent the part other than the conductor 61, 62 of the metallic thin-film capacitance 6 from contacting the inductance coil 5 and the ceramic capacitance board 2. Besides, the wires 53, 54 and the ground conductor 55 are bend as shown in FIG. 3C. As shown in FIG. 3D, after the ceramic capacitance board 2, the inductance coil 5 and the metallic thin-film capacitance 6 are electrically connected, a covering material 9 is used to wrap the ceramic capacitance board 2 and the metallic thin-film capacitance 6 so that only wires 53, 54, 55, 61 and 62 are exposed. As for the above covering method, one can place the ceramic capacitance board 2 and the metallic thin-film capacitance 6 in a plastic housing 10 and then fill it with covering materials 9. In addition, as shown in FIG. 3E, the above-mentioned EMI filter 100 can be placed in a metallic housing 20 to shield the electromagnetic interferences in order to enhance the effect of preventing electromagnetic interferences of an EMI filter. Furthermore, as shown in FIG. 3F, the above-mentioned EMI filter 100 can also be placed in a plastic housing 30 in order to prevent distortion, short circuit, and to make better appearance.

Figure 4A:
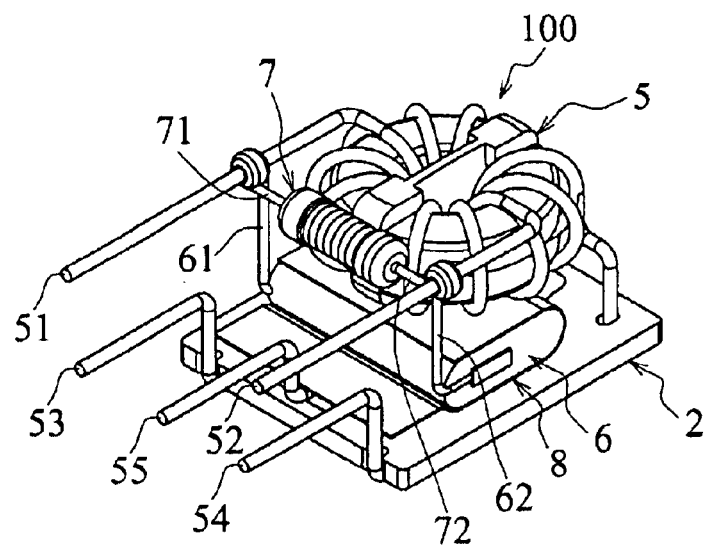
FIG. 4A is a three-dimensional diagram showing the electromagnetic interference filter according to a first embodiment of the invention.
Figure 4B:
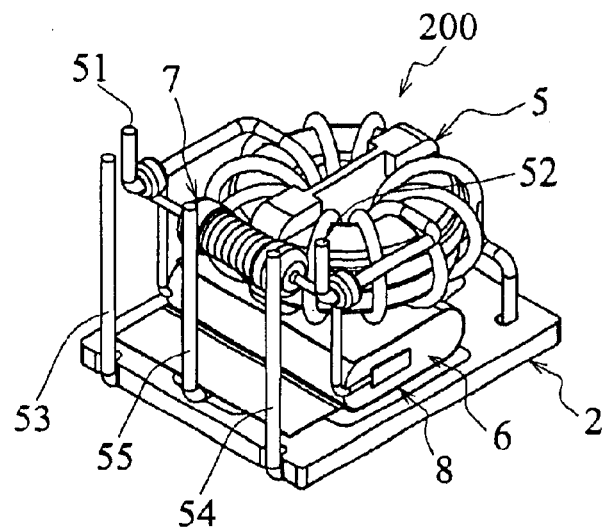
FIG. 4B is a three-dimensional diagram showing the electromagnetic interference filter according to a second embodiment of the invention.
Figure 4C:
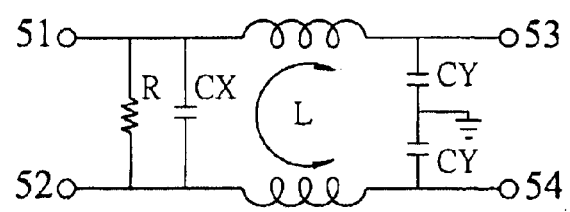
FIG. 4C is a schematic diagram showing the circuitry of the electromagnetic interference filter according to the first and the second embodiments of the invention.

Referring to FIG. 4A, the EMI filter 100 according to a first embodiment of the present invention includes an inductance coil 5, a ceramic capacitance board 2, a metallic thin-film capacitance 6, a ground conductor 55, a resistor 7 and an insulating sheet 8. In which, two wires 71 and 72 of the resistor 7 are electrically connected to wires 51 and 52 of the inductance coil 5 respectively, and wires 61 and 62 of the metallic thin-film capacitance 6 are electrically connected to wires 51 and 52 of the inductance coil 5 respectively. Resistor 7 and insulating sheet 8 are optional element. In addition, all of the wires 51, 52, 53 and 54 of the inductance coil 5 and the ground conductor 55 face toward a direction that is parallel to the ceramic capacitance board 2. However, as shown in FIG. 4B, the wires can also face toward a direction that is perpendicular to the ceramic capacitance board 2, which is the case for the EMI filter 200 according to a second embodiment of the invention. Under these circumstances, the circuit for the EMI filter 100 and 200 are the same, which is shown in FIG. 4C. In FIG. 4C, CX represents the metallic thin-film capacitance 6, CY represents the two capacitance electrode 21a and 21b of the ceramic capacitance board 2, and L represents the inductance coil 5.

Figure 5A:
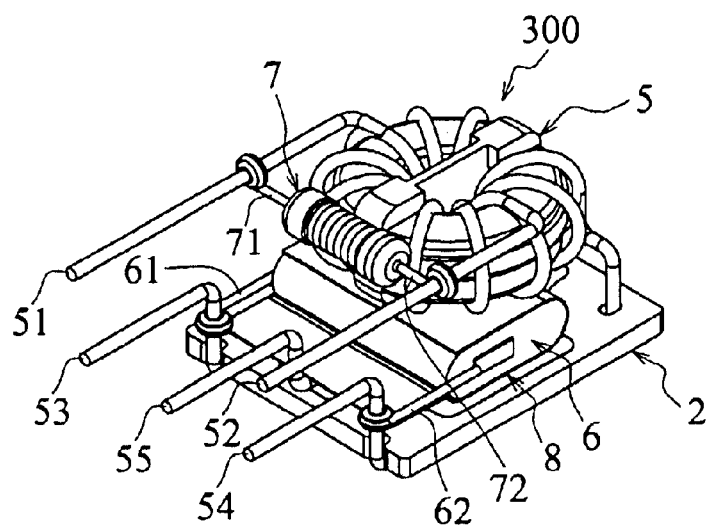
FIG. 5A is a three-dimensional diagram showing an electromagnetic interference filter according to a third embodiment of the invention.
Figure 5B:
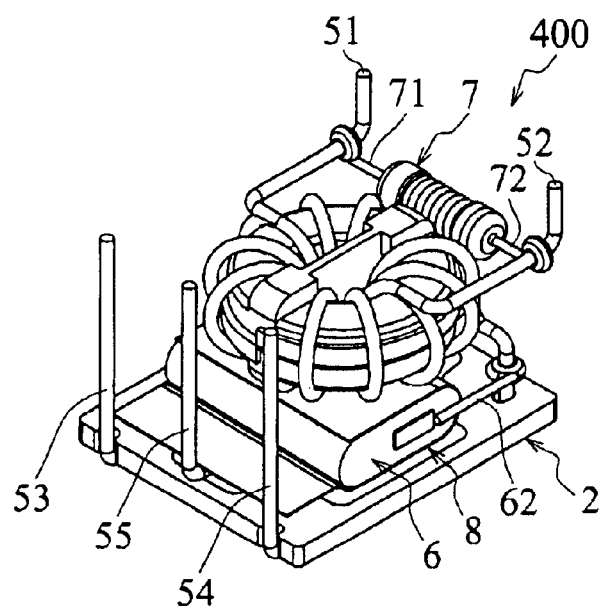
FIG. 5B is a three-dimensional diagram showing an electromagnetic interference filter according to a fourth embodiment of the invention.
Figure 5C:
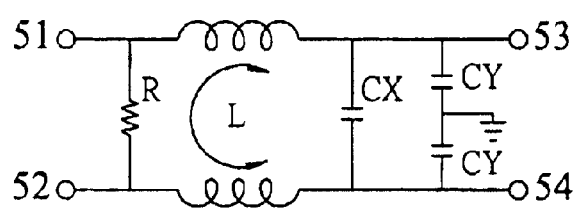
FIG. 5C is a schematic diagram showing the circuitry of the electromagnetic interference filter according to the third and the fourth embodiments of the invention.

Referring to FIG. 5A, an EMI filter 300 according to a third embodiment of the invention also includes an inductance coil 5, a ceramic capacitance board 2, a metallic thin-film capacitance 6, a ground conductor 55, a resistor 7 and an insulating sheet 8. In which, two wires 71 and 72 of the resistor 7 are electrically connected to wires 51 and 52 of the inductance coil 5 respectively, and wires 61 and 62 of the metallic thin-film capacitance 6 are electrically connected to wires 53 and 54 of the inductance coil 5 respectively. Resistor 7 and insulating sheet 8 are optional elements. In addition, wires 51, 52, 53 and 54 of the inductance coil 5 face a direction that is parallel to the ceramic capacitance board 2. However, as shown in FIG. 5B, the wires can also face toward a direction that is perpendicular to the ceramic capacitance board 2, which is the case for the EMI filter 400 according to a fourth embodiment of the invention. Under these circumstances, the circuit for the EMI filter 300 and 400 are the same, which is shown in FIG. 5C. In FIG. 5C, CX represents the metallic thin-film capacitance 6, CY represents the two capacitance electrode 21a and 21b of the ceramic capacitance board 2, and L represents the inductance coil 5. Herein, the direction that the wires 51, 52, 53 and 54, and the ground conductor 55 face toward and the bending process that they experience are different.

In regard to the EMI filters 100, 200, 300, and 400 of the first to fourth embodiments of the invention, we only use the covering material 9 (see FIG. 3D) to wrap the ceramic capacitance board 2 and the metallic thin-film capacitance 6 in one time rather than use the covering material 9 to wrap the ceramic capacitance board 2 and the metallic thin-film capacitance 6 respectively. Consequently, the cost for the covering materia can be cut down substantially, and the size of the whole EMI filter 100~400 can be reduced effectively. In addition, because the capacitance of the two capacitance electrodes of the ceramic capacitance board 2 can be adjusted by changing the size of the metallic thin-film area 21a, 21b and 22c, therefore, the capacitance CY is not restricted to the current specification and can have a broader applications. Furthermore, the wires 51, 52, 53, and 54 and the ground conductor 55 of the whole EMI filter 100~400 construct a complete circuit without any other non-electronic components, so the material and operating cost can be reduced. Furthermore, the metallic thin-film capacitance 6 and the ceramic capacitance board 2 can be electrically connected separately or together to other part so that the flexibility of application can be achieved.

On the other hand, the EMI filter 100~400 of the present invention can be placed in a metallic housing such as the metallic housing 20 as shown in FIG. 3E in order to strengthen the shielding of the electromagnetic interferences. Alternatively, the EMI filter 100~400 of the present invention can be placed in a plastic housing such as the plastic housing 10 as shown in FIG. 3D and the plastic housing 30 as shown in FIG. 3F to make better appearance and to prevent short-circuit.

To sum up, while the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An electromagnetic interference filter, comprising:
    an inductance coil with four wires extended therefrom;
    a ceramic capacitance board with a plurality of separate electrodes formed by a plurality of conductive films on a first surface and one conductive film on a second surface;
    a conductive film capacitor having two wires;
    a covering material wrapping the ceramic capacitance board and the conductive film capacitor; and
    a grounded wire;
    wherein two wires extended from the inductance coil are electrically connected to the electrodes and electrically connected to the wires of the conductive film capacitor, and one terminal of the grounded wire is electrically connected to the conductive film on the second surface of the ceramic capacitance board.

2. The electromagnetic interference filter of claim 1, wherein the covering material wraps the ceramic capacitance board and the conductive film capacitor after the ceramic capacitance board, the conductive film capacitor, and the inductance coil are electrically connected to each other.

3. An electromagnetic interference filter, comprising:
    an inductance coil with four wires extended therefrom;
    a ceramic capacitance board with a plurality of separate electrodes formed by a plurality of conductive films on a first surface and one conductive film on a second surface;
    a conductive film capacitor having two wires;
    a covering material wrapping the ceramic capacitance board and the conductive film capacitor; and
    a grounded wire;
    wherein two wires extended from the inductance coil are electrically connected to the electrodes while the other two wires extended from the inductance coil are electrically connected to the wires of the conductive film capacitor, and one terminal of the grounded wire is electrically connected to the conductive film on the second surface of the ceramic capacitance board.

4. The electromagnetic interference filter of claim 3, wherein the covering material wraps the ceramic capacitance board and the conductive film capacitor after the ceramic capacitance board, the conductive film capacitor, and the inductance coil are electrically connected with each other.

5. An electromagnetic interference filter (EMI filter) comprising:
    an inductance coil with a plurality of wires extended therefrom;
    a ceramic capacitance board with a plurality of electrodes formed by a plurality of conductive films on a first surface of the ceramic capacitance board and one conductive film on a second surface of the ceramic capacitance board;
    a conductive film capacitor having two wires; and
    a grounded wire having a first end and a second end opposite to the first end;
    wherein two wires extended from the inductance coil are electrically connected to the electrodes and the wires of the conductive film capacitor, or electrically connected to the electrodes while the other two wires extended from the inductance coil are electrically connected to the wires of the conductive film capacitor, and the first end of the grounded wire is electrically connected to the conductive film on the second surface of the ceramic capacitance board.

6. The electromagnetic interference filter of claim 5, wherein the number of the conductive films on the first surface is two.

7. The electromagnetic interference filter of claim 5, wherein the conductive film is a metallic film.

8. The electromagnetic interference filter of claim 5, wherein the conductive film capacitor is located above and not in contact with the second surface of the ceramic capacitance board.

9. The electromagnetic interference filter of claim 5, wherein the conductive film capacitor is not in contact with the second surface of the ceramic capacitance board.

10. The electromagnetic interference filter of claim 5 further comprising an insulating sheet covering the conductive film capacitor to insulate the conductive film capacitor from the ceramic capacitance board.

11. The electromagnetic interference filter of claim 5 further comprising an insulating sheet covering the conductive film capacitor to insulate the part other than the wires of the conductive film capacitor from the inductance coil.

12. The electromagnetic interference filter of claim 5, wherein the ceramic capacitance board and the conductive film capacitor are wrapped in a covering material.

13. The electromagnetic interference filter of claim 12, wherein the covering material wraps the ceramic capacitance board and the conductive film capacitor after the ceramic capacitance board, the conductive film capacitor and the inductance coil are electrically connected with each other.

14. The electromagnetic interference filter of claim 12 further comprising a first plastic housing integrated with the covering material.

15. The electromagnetic interference filter of claim 14 further comprising a conductive housing to accommodate the first plastic housing to shield against electromagnetic interferences.

16. The electromagnetic interference filter of claim 15 further comprising a second plastic housing to accommodate the conductive housing.

17. The electromagnetic interference filter of claim 5 further comprising a resistor with two wires of it electrically connected to the wires of the inductance coil and the wires of the conductive film capacitor.

18. The electromagnetic interference filter of claim 5, wherein the ceramic capacitance board has a shape selected from a group made up of rectangular, circular, polygonal, and regular and irregular shapes.

19. The electromagnetic interference filter of claim 5, wherein each terminal of the wires of the inductance coil and the second end of the grounded wire not contacted to the conductive film of the second surface are facing toward a direction that is parallel to the ceramic capacitance board.

20. The electromagnetic interference filter of claim 5, wherein each terminal of the wires of the inductance coil and the second end of the grounded wire not contacted to the conductive film of the second surface are facing toward a direction that is perpendicular to the ceramic capacitance board.

* * * * *